United States Patent [19]

Yaguchi

[11] Patent Number: 5,396,118
[45] Date of Patent: Mar. 7, 1995

[54] PRESSURE DETECTOR CIRCUIT

[75] Inventor: Osamu Yaguchi, Kashiwazaki, Japan

[73] Assignee: Kabushiki Kaisha Riken, Tokyo, Japan

[21] Appl. No.: 102,550

[22] Filed: Aug. 5, 1993

[30] Foreign Application Priority Data

Aug. 27, 1992 [JP] Japan .................................. 4-252194
Jun. 21, 1993 [JP] Japan .................................. 5-173713

[51] Int. Cl.$^6$ .............................................. H03K 5/153
[52] U.S. Cl. .................................. 327/516; 327/78
[58] Field of Search ............... 307/308, 350, 354, 356, 307/358, 360, 361, 362, 542.1

[56] References Cited

U.S. PATENT DOCUMENTS 4,445,093 4/1984 Kohler ........................... 307/308

FOREIGN PATENT DOCUMENTS 2222842 5/1990 Japan .

*Primary Examiner*—Steven L. Stephan
*Assistant Examiner*—Shawn Riley
*Attorney, Agent, or Firm*—Parmelee, Bollinger & Bramblett

[57] ABSTRACT

Pressure detector circuits are disclosed in which a pressure sensor is connected to an amplifier having an output signal. A three state comparator compares the output signal with a first reference voltage to provide a comparison output which is fed back in a feedback path to another input of the amplifier through a low-pass filter. A first controllable circuit source connected in series with the first reference resistor are connected in the feedback path to detect an open or short circuit condition of the pressure sensor. Another controllable current source connected in series with a second reference resistor and a voltage divider are also provided in the feedback path which in combination with the first current source detect breaks and short circuit conditions of the pressure sensor. A switch connected is parallel to a high value resistor having a resistance higher than that of a low value resistor in the low-pass filter is also provided in the feedback path.

8 Claims, 6 Drawing Sheets

PRESSURE DETECTOR CIRCUIT

BACKGROUND OF THE INVENTION

1. Field of the Invention

The present invention relates to a pressure detector circuit having a pressure to resistance transducer or sensor, and more particularly, to the circuit suitable for use in an automatic opening/closing apparatus, for example, a power window of an automobile to detect an obstacle between a window frame and a closing window glass thereof.

2. Description of the Prior Art

A power window device mounted on a door of an automobile drives a window glass received in the door by a motor. For example, a controller controls the motor to open the window glass by supplying reverse power to the motor when an obstacle is put or clamped between a window frame and the window glass during closing the window glass. Then, a pressure sensor is mounted or embedded in the door frame to detect the putting or clamping of the obstacle.

FIG. 1 shows the pressure to resistance transducer or sensor 10 that comprises a core metal or electrode 1, a pressure sensitive conductive or resistive rubber 2 coaxially provided or disposed around the core 1, a sheath metal electrode (or a wire braid) 3 disposed around the rubber 2 and a dielectric cover 4 disposed around the sheath 3.

The pressure sensor 10 generally increases exponentially its resistance Rs upon the application of pressure. Assuming the applied pressure to be P, the resistance Rs of pressure sensor 10 is rendered as follows:

$$Rs \propto KP^{-N}$$

where K and N are positive constants, respectfully. The present inventor proposed a basic pressure detector circuit in Japanese Patent Application (JPA) No. 2-198224 filed Jul. 26, 1990 and laid open for public inspection under JP-A-4-83136.

FIG. 2 shows the basic pressure detector circuit proposed by the inventor. It comprises a reference resistor 11 connected between an inverting input and an output of an operational (OP) amplifier 12. The inverting input of amplifier 12 is also grounded through the pressure sensor 10 as shown in FIG. 1. The output of amplifier 12 is connected to an output terminal 13 and an inverting input of a three-state comparator 14. The three-state comparator 14 has its noninverting input applied to a reference voltage from a reference voltage source 15 and its output is looped or fedback to a noninverting input of OP amplifier 12 through a low-pass filter 16. The low-pass filter 16 includes a resistor 17 connected between the output of comparator 14 and the noninverting input of amplifier 12, and a capacitor 18 connected between the noninverting input of amplifier 12 and ground. Therefore, the pressure detector circuit in ordinary condition provides an output voltage from the terminal 13 identical to the reference voltage even if a resistance of unpressured pressure sensor 10 upon manufacture deviates from a mean value and if an ambient temperature of the automobile equipped therewith is changed. When a force is abruptly applied to the pressure sensor 10, the output voltage is increased from the reference potential due to a time constant of the low-pass filter and then slowly returns to the reference potential. Then, sudden pressure on the pressure sensor 10 will be detected by another comparator (not shown) having a threshold voltage higher than the reference voltage.

The present inventor proposed pressure detector circuits in Japanese Patent Application Nos. 3-228389 to 3-228391 each filed on Aug. 13, 1991.

FIG. 3 shows the pressure detector circuit proposed by JPA No. 3-228391 that is similar to that of FIG. 2 except that reference resistor 11 and pressure sensor 10 are connected to ground and the output of amplifier 12, respectively. Additionally, a switch 19 and a voltage follower 20 are provided within the feedback loop.

The switch 19 is controlled by a signal SW to turn off the feedback loop when the window glass is driven upwardly by a motor (not shown). The voltage follower 20 includes another operational amplifier 20 having its inverting input connected to its output and a noninverting input of amplifier 12, and its noninverting input connected to a low-pass filter 16.

JPA No. 3-228389 is similar to that of FIG. 2 except that a switch 19 and a voltage follower 20 are provided within the feedback loop. JPA No. 3-228390 is similar to that of FIG. 2 except that the reference resistor 11 and pressure sensor 10 are connected to ground and the output of amplifier 12, respectively.

A controller (not shown) shuts down the power supply to the motor to stop the window glass moving after detection of an obstacle between a window frame and the window glass when the obstacle is put therebetween upon closing the window glass. A pressure sensor is used to detect the obstacle and comprises a conductive rubber or coating sensitive to pressure.

However, the above conventional pressure detector circuit cannot detect break and short circuit conditions of the pressure sensor 10 which is less reliable than other components such as resistors, capacitors and OP amps.

In the circuit shown in FIG. 3, the input voltage of voltage follower 20 will be changed upon turning off the switch 19 by a dielectric characteristic of a printed circuit board by ambient moisture or a drift of OP amps. The input voltage is afraid to be decreased slightly by a leakage current through the printed circuit board upon moving the window glass upwardly to stop the window glass by detecting an erroneous output voltage more than the predetermined threshold voltage. In contrast, The input voltage will be increased slightly by another leakage current to a positive supply through the printed circuit board to degrade sensitivity of pressure sensor 10.

SUMMARY OF THE INVENTION

It is a primary object of the invention to provide reliable pressure detector circuit by detecting a break or short circuit condition of a pressure sensor and wiring thereto.

It is another object of the invention to provide a reliable pressure detector circuit even if switch 19 is controlled to turn off and the printed circuit board is exposed to ambient moisture.

According to an aspect of this invention, a pressure detector circuit comprises:
- a pressure sensor having its resistance changed in response to the pressure to be applied;
- an amplifier operatively connected to said pressure sensor for deriving an output signal;
- a three-state comparator connected to said output of said amplifier for comparing said output signal with a first reference voltage to provide a detected output;

a low-pass filter connected to said output of said comparator; and a feedback means connected between said amplifier and said low-pass filter and including a reference resistor for detecting a condition of said pressure sensor and a transistor in series to said reference resistor.

These and other objects, features, and advantages of the invention will become more apparent upon a reading of the following detailed specification and accompanying drawings.

DESCRIPTION OF THE PREFERRED EMBODIMENTS

Figure 4:
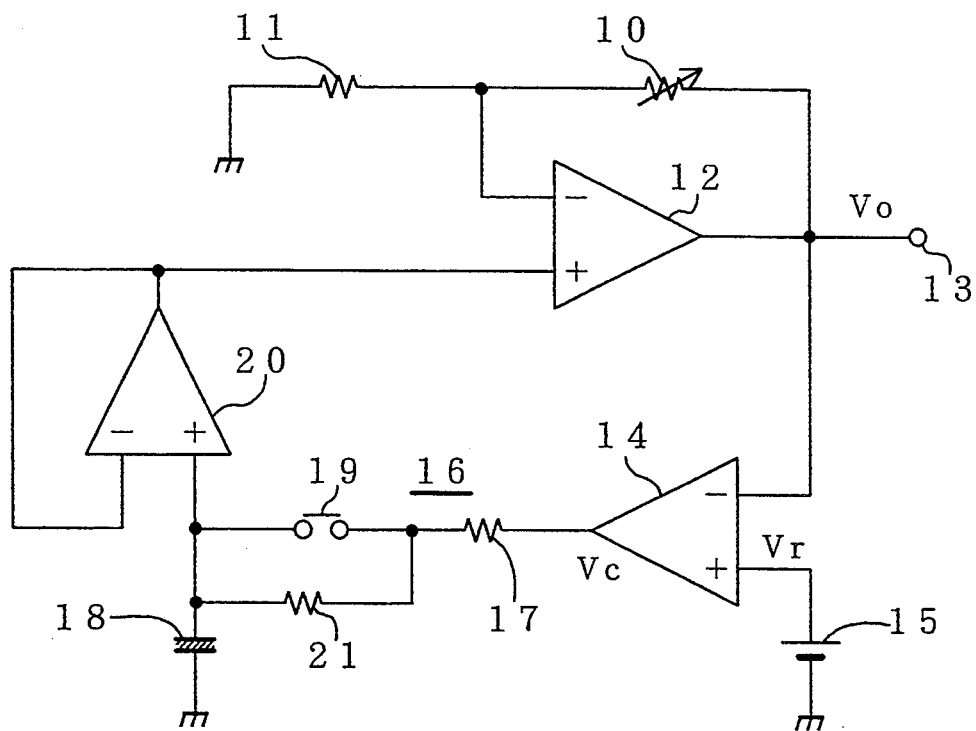
FIG. 4 shows a first embodiment of a pressure detector circuit according to the invention having a high resistor in parallel with the switch.

Referring now to FIG. 4, a first pressure detector circuit according to the invention is shown. It adds a high, for example, 1M Ω resistor 21 in parallel with the switch 19 which is higher than resistor 17. In FIG. 4, the same reference numerals are used to denote the same parts or members as those used in the embodiment in FIG. 1.

Figure 1:
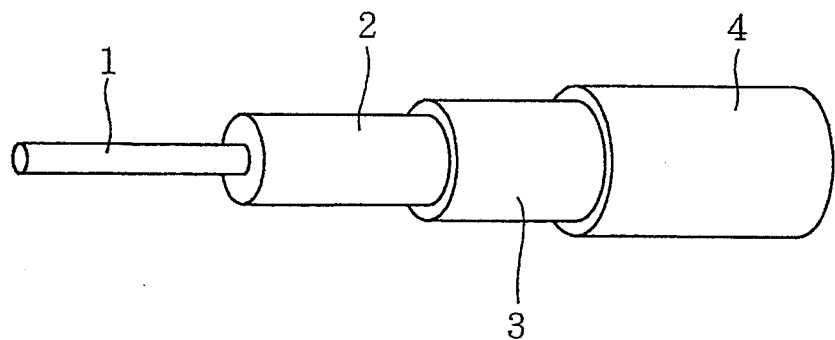
FIG. 1 shows a perspective view of a coaxial pressure cable according to the invention.
Figure 2:
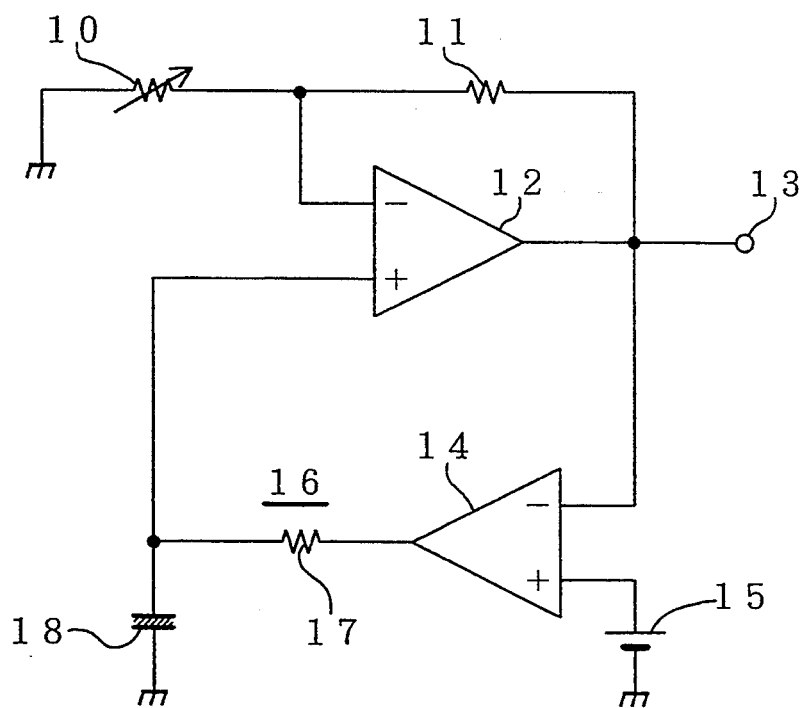
FIG. 2 shows a conventional pressure detector circuit with a temperature compensation.
Figure 3:
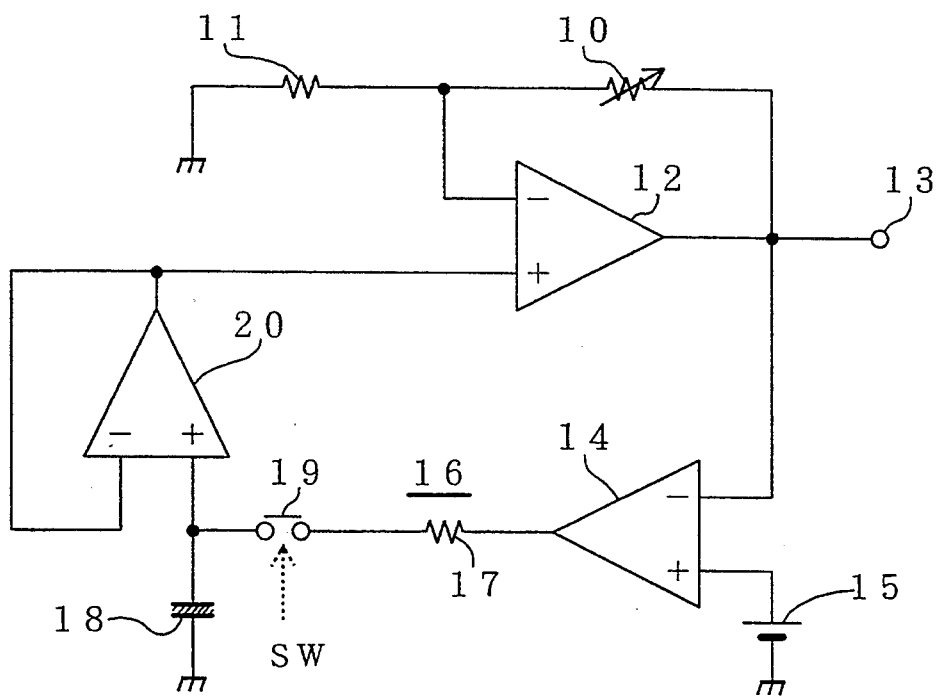
FIG. 3 shows another conventional detector circuit having a voltage follower and a switch.

In the first embodiment, the pressure detector circuit comprises an operational (OP) amplifier 12 having its inverting input connected to the pressure sensor 10 as shown in FIG. 1 and a reference resistor 11. The pressure sensor 10 has another end connected to an output of amplifier 12 while reference resistor 11 has another end connected to ground. The output of amplifier 12 is connected to an output terminal 13 to provide an output voltage Vo, and to an inverting input of a three-state comparator 14.

The three-state comparator 14 compares the output voltage Vo with a reference voltage Vr applied from a reference voltage source or regulator 15. Therefore, the comparator provides a three-state voltage Vc, that is, a logical "H" level substantially identical to a positive power supply voltage Vcc, a logical "L" level substantially identical to ground or a negative power supply voltage −Vcc, and a balance voltage when the output voltage is equal to the reference voltage.

Then, an output of three-state comparator 14 is looped or fedback to a noninverting input of OP amplifier 12 through a low-pass filter 16, a switch 19 and a voltage follower 20. The low-pass filter 16 includes a 10K Ω resistor 17 connected between the output of comparator 14 and relay contact 19, and a 100 µF capacitor 18 connected between the noninverting input of voltage follower 20 and ground. The switch 19 may be a relay contact or Complementary Metal Oxide Semiconductor (CMOS) transmission gate and is controlled by an SW signal (not shown) to turn off the feedback loop when the window glass is driven upwardly by a motor (not shown). The voltage follower 20 includes another OP amplifier 20 having its inverting input connected to its output and a noninverting input of amplifier 12, and its noninverting input connected to the capacitor 18. A 1M Ω resistor 21 is provided in parallel with the switch 19 to prevent the feedback loop from shielding or blocking.

Therefore, the pressure detector circuit under ordinary conditions provides an output voltage from the terminal 13 identical to the reference voltage with low drift characteristics even if a resistance of the unpressured pressure sensor 10 upon manufacture deviates from its mean value and if an ambient temperature of the automobile equipped therewith is changed. When a force is applied abruptly to the pressure sensor 10, the output voltage is increased from the reference potential due to a time constant of the low-pass filter and then slowly returns to the reference potential. Then, sudden pressure to the sensor 10 will be detected by another comparator (not shown) having a threshold voltage higher than the reference voltage.

Figure 5:
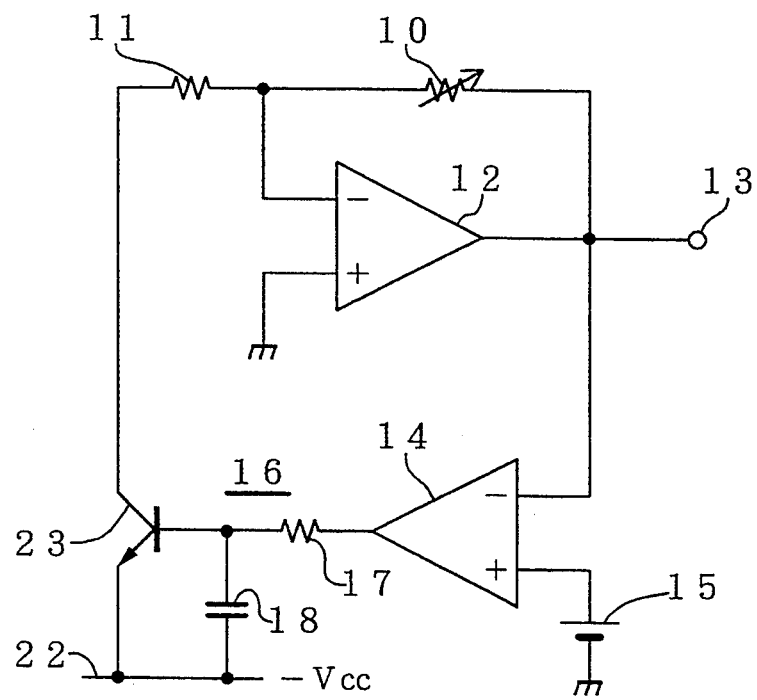
FIG. 5 shows a second embodiment of the pressure detector circuit according to the invention having a controlled current source.

FIG. 5 shows a second embodiment of a pressure detector circuit of the invention. It detects conditions of the pressure sensor 10 by monitoring the terminal voltage of the reference resistor 11 at an end remote from its end connected to the inverting input of amplifier 12. In FIG. 5, the same reference numerals are used to denote the same parts or members as those used FIG. 4, and detailed descriptions are omitted.

In the second embodiment, the pressure detector circuit comprises OP amplifier 12 having a grounded noninverting input. The OP amplifier 12 and three-state comparator 14 are therefore connected to a positive supply line (not shown) and negative supply line (or −Vcc line) 22 to provide, for example, ±6 volts. It further comprises an NPN transistor 23, as a controlled current source to resistor 11, having an emitter connected to negative line 22, a base connected to the low-pass filter, and a collector connected to reference resistor 11. The capacitor 18 may be connected to the base of transistor 23 and ground or negative line 22.

Then, an output current of three-state comparator 14 is supplied to the base of transistor 23 through resistor 17 of the low-pass filter 16 and then looped or fedback from its collector to the inverting input of OP amplifier 12 through resistor 11. The collector current is controlled proportional to the resistance of pressure sensor 10, so that the output voltage is equal to, for example, a 3 volts' reference voltage from voltage source or regulator 15.

Therefore, the second pressure detector circuit under ordinary conditions provides a 3 volts' output voltage from output terminal 13 with low drift characteristics even if a resistance of the unpressured pressure sensor 10 upon manufacture deviates from the mean value of the resistances and if an ambient temperature of the automobile equipped therewith is changed. When a force is abruptly applied to the pressure sensor 10, the output voltage is increased from the 3 volts due to the time constant of the low-pass filter. Then, sudden pressure to the sensor 10 will be detected by another comparator (not shown) having a threshold voltage higher than the reference voltage.

It should be noted that the terminal voltage of reference resistor 11 is proportional to the resistance of pressure sensor 10 because the voltage drop across to pressure sensor 10 is constant or identical to the reference voltage, and the same current flows through pressure sensor 10 and reference resistor 11 since the input current of OP amplifier 12 is assumed to be negligible. If the resistance of pressure sensor 10 is assumed to be identical to that of resistor 11, then the terminal voltage will be minus 3 volts. If pressure sensor 10 is shorted to provide zero ohms, then the terminal voltage will go to minus 5.5 volts upon assuming the saturated collector to emitter voltage to be 0.5 volt. If pressure sensor 10 is broken to provide infinite resistance, then the terminal voltage will become zero volts. Therefore, a short circuit or a broken condition of the pressure sensor can be monitored by the terminal voltage.

Figure 6:
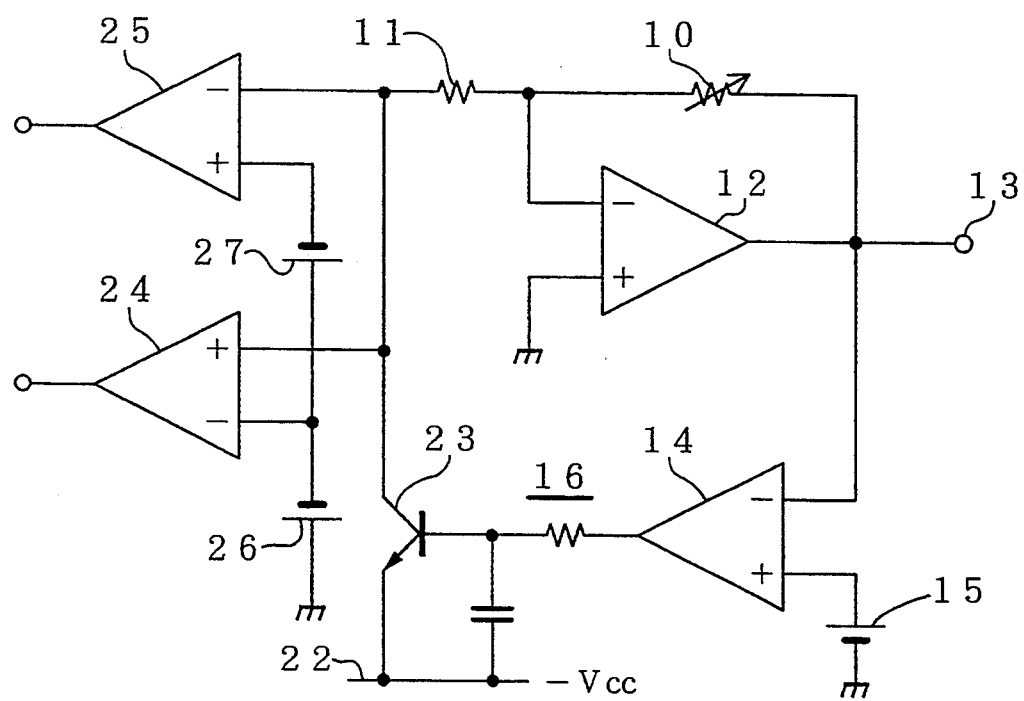
FIG. 6 shows a third embodiment of the pressure detector circuit according to the invention having a controlled current source and window comparators.

FIG. 6 shows a third embodiment of a pressure detector circuit of the invention in which upper and lower limits for sensor 10 are provided by using comparators 24 and 25 to detect break and short circuit conditions of the pressure sensor 10.

The second comparator 24 for detecting the break has a noninverting input connected to the collector of transistor 23, and an inverting input connected to ground through a second reference voltage source 26 having a low voltage less than minus 0.6 volt. The voltage source 26 may be a Schottky or general use silicon or germanium diode and a pull-up resistor from −Vcc. To provide less than 0.1 v, voltage divider or potentiometer may be paralleled to the diode 26. When pressure sensor 10 is broken, the sensor current is reduced to zero milliampere because the pressure detector circuit controls itself so that the output voltage maintains the reference potential. Therefore, the terminal voltage is reduced to zero volts.

The third comparator 25 for detecting a short circuit has an inverting input connected to the collector of transistor 23, and a noninverting input connected to the second voltage source 26 through a third reference voltage source 27 having more than minus 1.25 V. The voltage source 27 may be a bandgap or shunt voltage regulator cascaded to diode 26 and another pull-up resistor from −Vcc. When pressure sensor 10 is shorted, the sensor current will be increased to the maximum rating current or about 20 milliamperes of OP amplifier 12 because the pressure detector circuit self-controls so that the output voltage maintains the reference potential. However, the sensor current is limited by reference resistor 11 and the terminal voltage is increased to about minus 5.5 volts considering the saturation of transistor 23.

Alternatively, the reference voltage sources 26 and 27 include two diodes connected to ground and power supply line 22, respectively and a pull-up resistor connected between the diodes.

In practice, the resistance of pressure sensor 10 is changed exponentially, for example, 390K Ω to 100Ω corresponding to linear unpressured to pressured conditions thereof, respectively.

Figure 7:
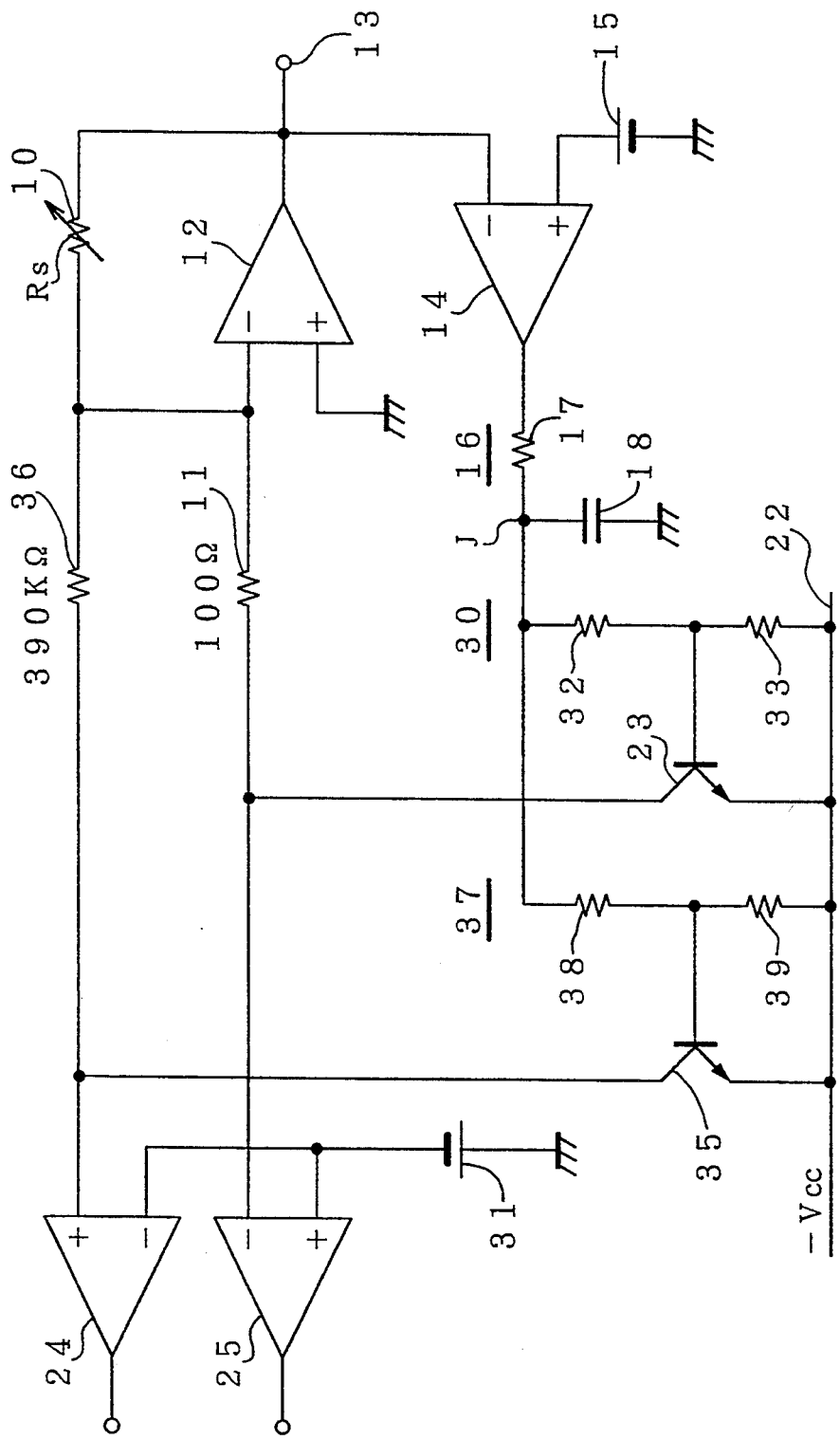
FIG. 7 shows a fourth pressure detector circuit according to the invention having two controlled current sources each followed by a comparator.

FIG. 7 shows a fourth pressure detector circuit according to the invention that has two controlled current sources and two reference resistors. In FIG. 7, components, parts or members corresponding to those of FIG. 6 allocate the same reference numerals, respectively.

This pressure detector circuit comprises an OP amplifier 12 having an inverting input connected to an output through a pressure sensitive sensor 10. The amplifier 12 also has a noninverting input connected to ground, and the output connected to an output terminal 13 and an inverting input of three-state comparator 14. A noninverting input of the comparator 14 is connected to a reference voltage source 15 that applies a positive reference voltage thereto. Its output is connected to a base of an NPN transistor 23 through a low-pass filter 16 and a voltage divider 30. The transistor 23 is emitter-coupled to a negative supply line 22 for amplifier 12 and comparator 14, and has its collector connected to the inverting input of amplifier 12 through, for example, 100Ω reference resistor 11.

The pressure detector circuit controls the collector current of transistor 23, or the sensor current of pressure sensor 10, so that an output voltage of amplifier 12 is equal to the reference voltage under an unpressured condition of pressure sensor 10. Conditions of pressure sensor 10 are detected by monitoring the collector current or a current flowing through 100Ω reference resistor 11. Accordingly, connected to the collector of transistor 23 is a comparison input of a second comparator 25 that detects a short circuit condition of pressure sensor 10, and has its reference input connected to a second reference voltage source 31 that applies a negative reference voltage.

The low-pass filter 16 includes a resistor 17 connected between the output of three-state comparator 14 and a junction J to voltage divider 30, and a grounded capacitor 18 connected to junction J to derive a time constant from multiplying the resistance of resistor 17 and the capacitance of capacitor 18. The voltage divider 30 includes a pair of resistors 32 and 33 in series to negative supply line 22 and the junction connected to the base of transistor 23 to provide a first division ratio, for example, ⅓.

Additionally connected to the inverting input of OP amplifier 12 is a collector of a second NPN transistor 35 through a second or, for example, 390K Ω reference resistor 36 that detects a break condition of pressure sensor 10. The second transistor 35 is also emitter-coupled to the negative supply line 22. On the other hand, junction J of low-pass filter 16 is connected to a base of second transistor 35 through a second voltage divider 37. Connected to the collector of transistor 35 is a comparison input of a third comparator 24, which detects the break condition of pressure sensor 10, and has its reference input connected to the second reference voltage source 31. The second voltage divider 37 also includes a pair of resistors 38 and 39 in series to line 22 to provide a second division ratio, for example, ½. Then, the first division ratio is preferably set less than the second division ratio so that transistor 23 is active upon the saturation of transistor 35, and transistor 23 is in an off state upon the activation of transistor 35.

Figure 8:
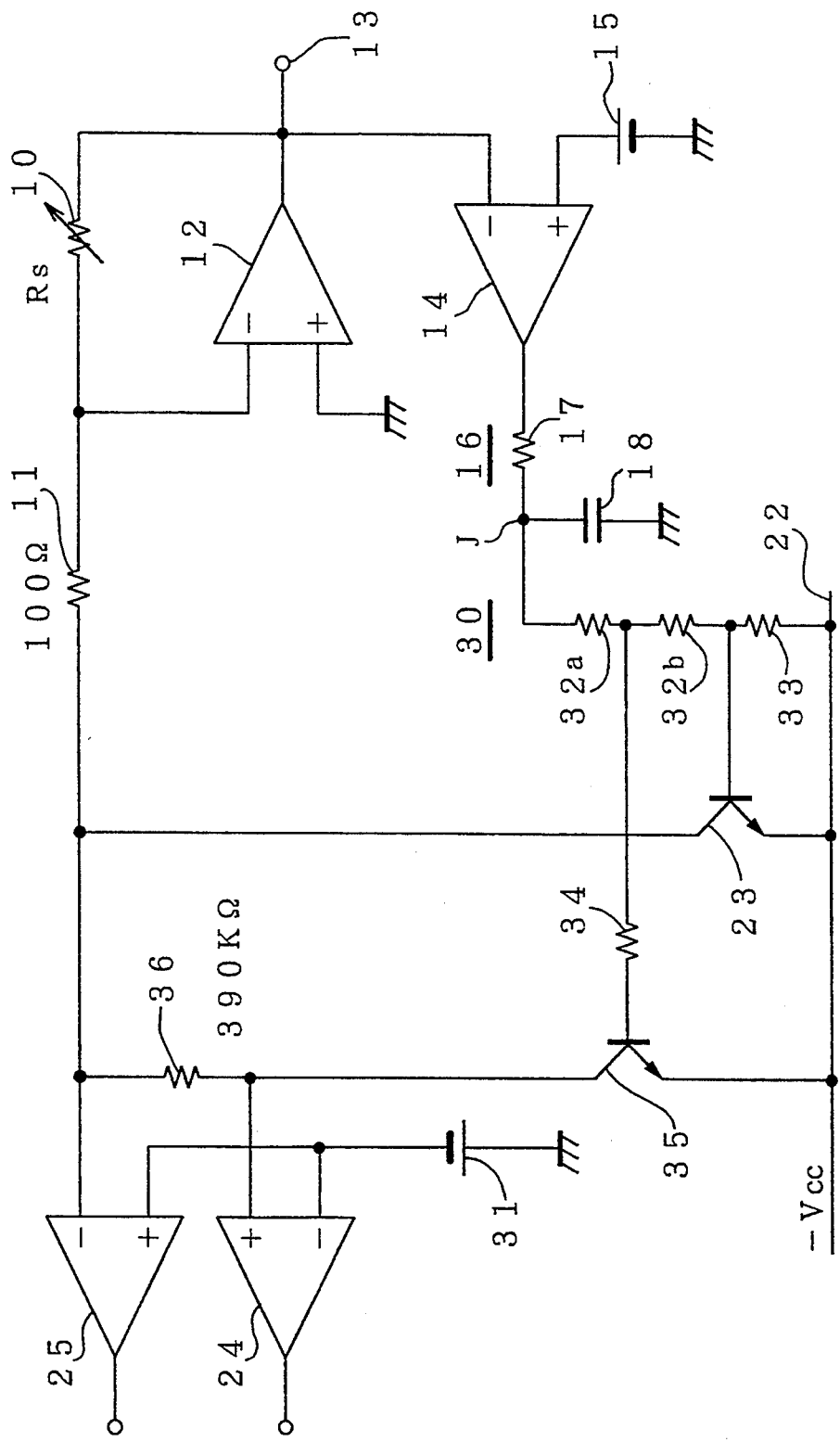
FIG. 8 shows a modification of the pressure detector circuit in FIG. 7.

FIG. 8 is a variation of FIG. 7. The only change is that a second reference resistor 36 is connected to the collector of transistor 23, and resistor 32 is divided into two resistors 32a and 32b to provide an intermediate node to be connected to the base of transistor 35 through a 100K Ω limit resistor 34. Therefore, the resistance of the limit resistor 34 is determined not to effect the division ratios while maintaining a saturated condition of transistor 35.

The pressure detector circuits of the invention as shown in FIGS. 4 to 8 have advantages to compensate resistance drifts of pressure sensor 10 by temperature characteristics, age deterioration, and deviation in manufacture. For example, the output voltage of terminal 13 will be increased or go up from the reference potential when the change of ambient temperature causes resistance Rs of pressure sensor 10. However, three-state comparator 14 goes low level to decrease the base current of transistor 23 through low-pass filter 16, and then its collector current or the sensor current, and finally returns the output voltage to reference potential. Then, the output voltage maintains substantially the reference potential without its differential voltage because a rate of change or degree of the ambient temperature is lower than the time constant of low-pass filter 16.

Upon pressing pressure sensor 10 by an obstacle, the rate of change of resistance Rs is higher than the time constant and reveals as the changing of the output voltage that is detected by other comparator (not shown) to stop or reverse a drive motor (not shown) for window glass.

However, the pressure detector circuits shown in FIGS. 4 to 8 may be weaken by circumferential noise because the pressure sensor 10 as shown in FIG. 1 has the same configuration as general use coaxial cable used as a negative feedback resistor.

Therefore, a drift of the output voltage of amplifier 12 is generated. To suppress the drift, a method of a noise suppression capacitor connected in parallel to pressure sensor 10 might be considered. However, the capacitance of the suppressed capacitor is constant while the resistance of pressure sensor 10 is changed. When the resistance of pressure sensor 10 is moved to higher value, the rate of change of the output voltage is small relative to that of resistance Rs in the higher value to cause a phase delay to the pressure response and sensitivity to pressure of the detector circuit which provides a degradation in results. The resistance Rs is widely changed by the ambient temperature and the sensor current flowing through the pressure sensor 10 as well as pressure P to be applied.

Figure 9:
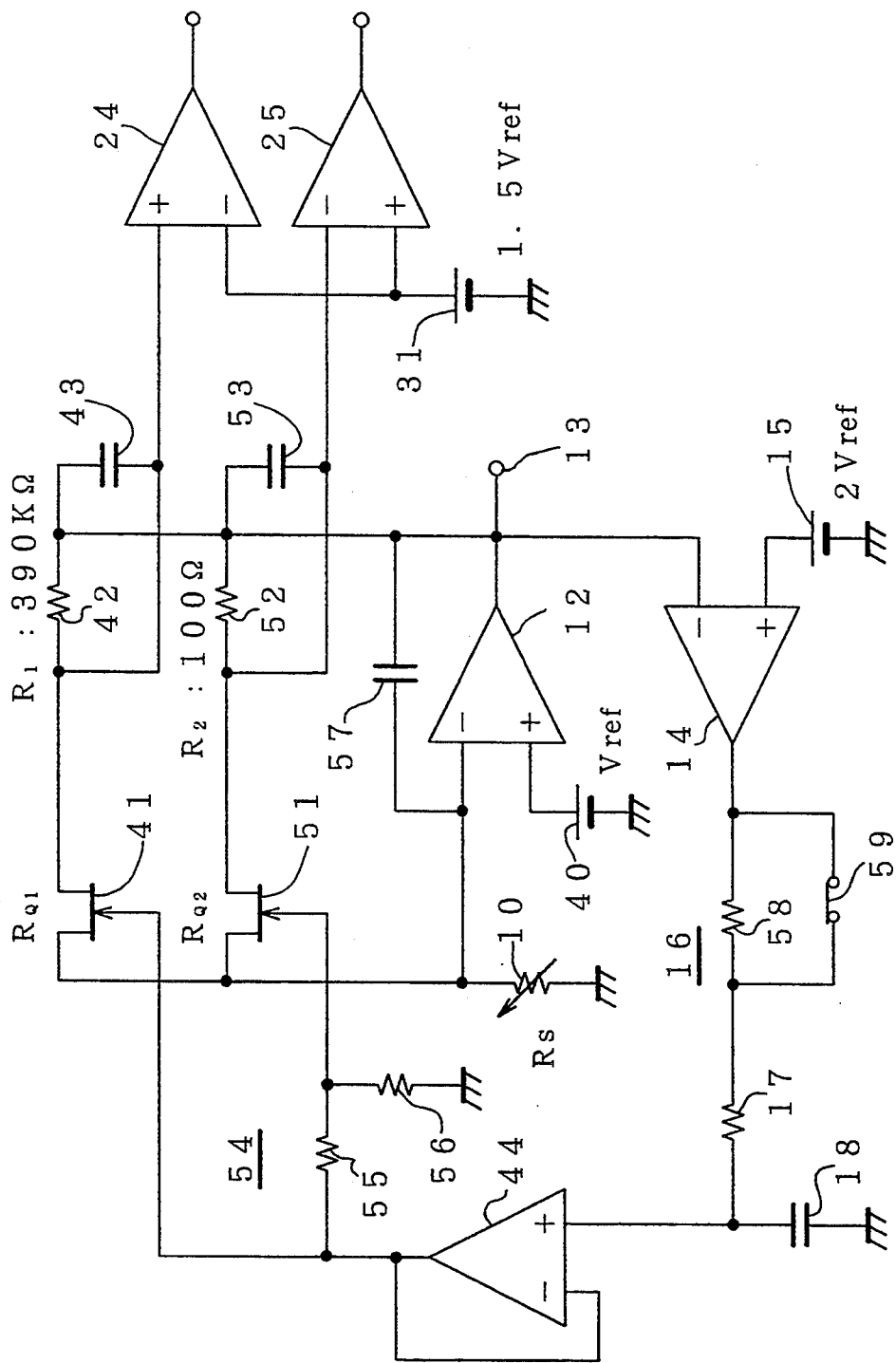
FIG. 9 shows a sixth pressure detector circuit according to the invention having two controlled variable resistor elements each followed by a comparator.

FIG. 9 shows a fifth embodiment of a pressure detector circuit according to the invention having high reliable obstacle detection and a noise tolerant pressure sensor.

In FIG. 9, components, parts or members corresponding to those of FIG. 7 allocate the same reference numerals, respectively and detail descriptions are omitted.

The pressure detector circuit according to the invention comprises a pressure sensor 10 as shown in FIG. 1 having its resistance responsive to applied pressure.

The pressure sensor 10 is connected between an inverting input of amplifier 12 and ground, so that its end or core electrode 1 is connected to the inverting input and that its sheath electrode 4 is connected to ground to shield the core electrode 1 to enhance the noise tolerance characteristic of the core electrode 1.

The amplifier 12 receives power from a unity power supply having, for example, 12 volts. A reference voltage source 40 that applies a positive reference voltage is connected between a noninverting input of amplifier 12 and ground. Alternatively, upon using positive and negative power supplies, the noninverting input is grounded and another end or sheath electrode 4 of pressure sensor 10 is connected to a negative reference voltage source 40. In both cases, a first constant reference voltage is applied to pressure sensor 10. A Field Effect Transistor (FET) 41 is source-coupled to the inverting input of amplifier 12. The FET 41 has its drain connected to a detecting output of amplifier 12 through, for example 390K Ω resistor 42 for detecting a break in the pressure sensor 10 and associated wiring.

The detecting output of amplifier 12 is connected to an output terminal 13 and an inverting or comparison input of a three-state comparator 14. The comparator 14 has its noninverting or reference input connected to a second reference voltage source 15, and its comparison output is connected to a gate of FET 41 through a low-pass filter 16 and a voltage follower 44. The second reference voltage source 15 supplies a second reference voltage twice the first reference voltage. Accordingly, the comparator compares the detecting voltage of amplifier 12 with the second reference voltage to obtain a resulting comparison signal to be applied to the gate of FET 41 through the low-pass filter 16 and voltage follower 44 to control the detecting output voltage to equal the second reference voltage or potential. Then, the detecting output or output voltage from terminal 13 detects the clamping of an obstacle in response to the applied pressure to pressure sensor 10 by putting or clamping it at a rate or speed degree to close, for example, a window glass of an automobile door.

The comparison signal for the comparison output has three states namely conditions, or a balancing voltage when the output voltage is equal to the second reference voltage, a low level voltage when the output voltage is down from or less than the second reference voltage when pressing pressure sensor 10, and a high level voltage when the output voltage is up from or more than the second reference voltage with, for example, suddenly heating the pressure sensor 10. Low voltage type dual or quadruple operational amplifiers (or integrated circuits) are used for amplifier 12, comparator 14 and voltage follower 44.

The drain of FET 41 connected to the break detecting resistor 42 is coupled or branched to a comparison input of a second comparator 24 that detects a first condition or break condition of pressure sensor 10. The second comparator 24 has its reference input connected to a third reference voltage source 31. The third reference voltage source 31 outputs as a third reference voltage between voltage of the first and second reference voltages. Then, upon using the 390K Ω resistor 42, pressure sensor 10 is deemed to be broken when an internal or drain-source resistance is higher than 390K Ω. Therefore, the critical resistance of pressure sensor 10 considered as a break is 780 KΩ. A capacitor 43 is paralleled to resistor 42 to compensate drift changes and drift phase delays of the output voltage.

On the other hand, a second FET 51 is source-coupled to the inverting input of amplifier 12. The FET 51 has its drain connected to the detecting output of amplifier 12 through, for example 100Ω resistor 52 for detecting a short circuit of pressure sensor 10 and associated wiring. A voltage divider circuit 54 is provided between a gate of FET 51 and voltage follower 44. The divider 54 includes two series resistors 55 and 56, or a 3-terminal variable resistor such as potentiometer. Its division ratio is predetermined so that FET 51 is active when the voltage applied to the gate of FET 41 controls FET 41 to an "ON" or saturated condition.

Accordingly, during activating FET 51, FET 41 goes to a saturated state, for example, 50Ω. The saturated FET 41 does not effect FET 51 because of neglecting a current flowing through 390K Ω resistor 42 in series to FET 41. Upon using the 100Ω resistor 52, pressure sensor 10 is deemed to be shorted when an internal or drain-source resistance is less than 100Ω. Therefore, the critical resistance of pressure sensor 10 considered as a short circuit is 200Ω. Another capacitor 53 is paralleled to resistor 52 to compensate for drift changes and drift phase delays of the output voltage. A 47 pF capacitor 57 is connected between the inverting input and output of amplifier 12 to absorb noises and low drifts of the output voltage.

The low-pass filter 16 in this embodiment comprises a 51Ω low resistor 17, a 1M Ω high resistor 58 connected between the low resistor 17 and the output of comparator 14, and a switch 59 connected in parallel to the high resistor 58. The low resistor 17 has another end connected to a 22 μF capacitor 18 and an input of voltage follower 44. The voltage follower 44 prevents the output impedance of low-pass filter 16 from affecting the input impedance of voltage divider 54. Therefore, it applies a voltage identical to a terminal voltage of capacitor 18 to the gate of FET 41. Though an OP amplifier is used as voltage follower 44 in this embodiment, the voltage follower may be substituted with an emitter follower or source follower.

The switch 59 is controlled by a control signal (not shown) to turn off during closing of the window glass. Then, the switch 59 compensates for drifts of dielectric characteristics of the pressure detector circuit printed board by ambient moisture associated with resistor 17 upon turning on.

Above embodiment uses variable resistance characteristics in low drain to source voltage regions of FETs 41 and 51 by gate voltages thereof. Then, these FETs can be substituted with NPN transistors having inherent controllable current regulated characteristics when emitter to collector voltages to be applied are more than 0.5 volt. Therefore, an NPN transistor substituted with FET 41 is emitter-coupled to the inverting input of amplifier 12, and has a collector connected to the detecting output of amplifier 12 through the break detecting resistor 42 and a base connected to the output of voltage follower 44 through an additional 1K Ω protection resistor. Another NPN transistor substituted with FET 51 is also emitter-coupled to the inverting input of amplifier 12, and has a collector connected to the detecting output of amplifier 12 through the short circuit detecting resistor 52 and a base connected to the voltage divider 54.

The operation of the pressure detector circuit in this embodiment is described as follows. First, when power to the detector circuit is turned on, the three-state comparator 14 charges energy to capacitor 18 through switch 59 and resistor 17 to provide an ordinary condition in which the output voltage of amplifier 12 is equal to the second reference potential even if the resistance of pressure sensor 10 is deviated. Under ordinary conditions, the output voltage of amplifier 12 becomes equal to the second reference potential by comparator 14, low-pass filter 16, voltage follower 44 and FET 51 even if the resistance of pressure sensor 10 is gradually changed by change of atmosphere or ambient temperature.

Then, the internal resistance (drain to source resistance) of FET 41 is assumed to be $R_{Q1}$, the resistance of resistor 42 is assumed to be $R_1$, the internal resistance of FET 51 is assumed to be $R_{Q2}$, and the resistance of resistor 42 is assumed to be $R_2$. In the ordinary condition, the following equation is derived since the voltage difference between the inverting input and detecting output of amplifier 12 is identical to that between the inverting input and ground. Then, $$Rs = (R_{Q1}+R_1) \| (R_{Q2}+R_2)$$

When the window glass is driven toward a closing direction by a motor (not shown), switch 59 is controlled to turn off synchronously. The voltage drop across resistors 58 and 17 is increased slightly since a leakage current of capacitor 18 and input current of voltage follower 44 are supplied through resistors 58 and 17. However, the output of comparator 14 will absorb such an increased component of the voltage drop to maintain the ordinary condition.

When pressure sensor 10 is pressed by putting or clamping an obstacle between the window glass and the window frame, its resistance is abruptly decreased to increase the output voltage of amplifier 12 from an ordinary value identical to the second reference voltage. The comparison signal or output of comparator 14 also goes abruptly up to an upper saturated voltage near the positive power supply voltage to gradually charge the capacitor 18 through resistors 58 and 17. The output voltage of the detecting output goes up within a predetermined period because the output voltage of voltage follower 44 or gate voltages of the FETs are almost all maintained constant or with a gentle gradient.

The capacitor 57 is necessary to suppress low drifts of the output voltage. As resistance Rs increases, drift of the output voltage to the resistor change decreases, and its response time is prolonged. Though it results in deterioration of pressure detecting sensitivity, the addition of capacitors 43 and 53 resolve this problem. As the resistance of pressure sensor 10 becomes large (or small), the effect of capacitor 43 and 53 became small (or large) to increase (or decrease) internal resistances of FETs to automatically provide an appropriate response characteristic of the output voltage.

Accordingly, at a point when pressure is applied to pressure sensor 10, the output voltage goes up more than the predetermined threshold to detect an output using a fourth comparator (not shown) which is latched or placed in memory. A control circuit (not shown) controls the window glass to open it based on bit data already latched and then to remove the obstacle from the putting space.

If the closure action of the window glass is only stopped under the pressed condition of pressure sensor 10 or clamped condition in which the recessed portion of the obstacle is put or clamped between the window glass and window frame, the output voltage reached to the detecting level returns gradually to the second reference potential or voltage, and it is difficult to remove the recessed obstacle. Therefore, the power window preferably memorizes the switching from the closure to open actions of the window glass when clamping of the obstacle is detected. After the window glass is opened perfectly, switch 59 is controlled to turn on to discharge quickly through resistor 17 and return to the ordinary condition.

As described above, conditions of pressure sensor 10 are generally monitored under the ordinary condition in which the output voltage is equal to the second reference potential. The pressure sensor 10 has resistance Rs changed between 780K Ω and 200Ω. The resistance limits are detected by the drain voltage of FET 41 or 51. If the resistance Rs is more than 780K Ω, a comparison output of comparator 24 goes H logical level. Therefore, a break condition of pressure sensor 10 is defined upon outputting the H logical level. When pressure sensor 10 is broken perfectly, the output voltage is equal to the inverting input voltage of amplifier 12.

If the resistance Rs is less than 200Ω, another comparison output of comparator 25 goes H logical level. Therefore, short circuit condition of pressure sensor 10 is defined upon outputting the H logical level. When pressure sensor 10 is shorted perfectly, the output voltage is increased to about positive power supply voltage.

Thus, it will be appreciated that various modification, alternatives, variations, etc., may be made without departing form the spirit and scope of the invention as defined in the appended claims, It is, of course, intended to cover by the appended claims all such modifications which fall within the scope of the claims.

What is claimed is:

1. A pressure detector circuit comprises:
    a pressure sensor having its resistance changed in response to applied pressure;
    an amplifier operatively connected to said pressure sensor and having an output for deriving an output signal;
    a three-state comparator connected to said output of said amplifier for comparing said output signal with a first reference voltage to provide a comparison output;
    a low-pass filter connected to said comparison output;
    a feedback means connected between said amplifier and said low-pass filter including a first reference resistor for detecting a condition of said pressure sensor and a first transistor connected in series to said first reference resistor;
    said low-pass filter comprising a first low value resistor connected between said output of said three-state comparator and said amplifier through a switch, and said switch being connected in parallel to a second high value resistor having a resistance higher than that of said first low value resistor.

2. A pressure detector circuit according to claim 1, in which said feedback means further includes a second comparator connected to said first reference resistor and said first transistor and a second reference voltage; and
    a third comparator connected to both said first reference resistor and a third reference voltage.

3. A pressure detector circuit according to claim 1, in which said feedback means further includes:
    a second reference resistor for detecting another condition of said pressure sensor and a second transistor connected in series to said second reference resistor, and said second transistor being connected with said low-pass filter through a voltage divider;
    a second comparator connected to both said first reference resistor and said first transistor and a second reference voltage; and
    a third comparator connected to both said second reference resistor and said second transistor and said second reference voltage.

4. A pressure detector circuit according to claim 3, in which said pressure sensor is connected to an inverting input of said amplifier;
    said first transistor being a bipolar transistor emitter-coupled to a power supply line, and having a base connected to said low-pass filter through said first voltage divider and a collector connected to said inverting input of said amplifier through said first reference resistor; and
    said second transistor being also a bipolar transistor emitter-coupled to said power supply line, and having a base connected to said low-pass filter through a second voltage divider and a collector connected to said inverting input of said amplifier through said second reference resistor.

5. A pressure detector circuit according to claim 3, in which said pressure sensor is connected to an inverting input of said amplifier;
    said first transistor being a field effect transistor source-coupled to said inverting input, and having a gate connected to said low-pass filter through said first voltage divider and a drain, connected to said output of said amplifier through said first reference resistor; and
    said second transistor also being a field effect transistor source-coupled to said inverting input, and having a gate connected to said low-pass filter and a drain connected to said output through said second reference resistor.

6. A pressure detector circuit according to claim 3, in which said pressure sensor is connected to an inverting input of said amplifier;
    said first transistor being a bipolar transistor emitter-coupled to said inverting input, and having its base connected to said low-pass filter through said first voltage divider and a collector, connected to said output of said amplifier through said first reference resistor; and
    said second transistor also being a bipolar transistor emitter-coupled to said inverting input, and having a base connected to said low-pass filter through a limit resistor and its collector connected to said output through said second reference resistor.

7. A pressure detector circuit according to claim 4, 5 or 7, further comprising a voltage follower connected between said low-pass filter and said first voltage divider.

8. A pressure detector circuit comprising:
    a pressure sensor having its resistance changed in response to applied pressure;
    an amplifier operatively connected to said pressure sensor and having an output for deriving an output signal;
    a three-state comparator connected to said output of said amplifier for comparing said output signal with a first reference voltage to provide a detecting output; and
    a low-pass filter connected between an output of said comparator and said amplifier, and said low-pass filter including a low value resistor connected between said output of said comparator and said amplifier through both a switch and a high value resistor having a resistance higher than that of said low value resistor.

* * * * *